(12) United States Patent
Yuan et al.

(10) Patent No.: US 11,341,923 B2
(45) Date of Patent: May 24, 2022

(54) SHIFT REGISTER UNIT, DRIVING METHOD THEREOF, GATE DRIVING CIRCUIT AND DISPLAY PANEL

(71) Applicants: Hefei BOE Joint Technology Co.,Ltd., Hefei (CN); BOE TECHNOLOGY GROUP CO., LTD., Beijing (CN)

(72) Inventors: Zhidong Yuan, Beijing (CN); Pan Xu, Beijing (CN); Yongqian Li, Beijing (CN); Can Yuan, Beijing (CN)

(73) Assignees: Hefei BOE Joint Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/206,121

(22) Filed: Mar. 19, 2021

(65) Prior Publication Data
US 2021/0335269 A1    Oct. 28, 2021

(30) Foreign Application Priority Data
Apr. 23, 2020    (CN) .......................... 202010328861.8

(51) Int. Cl.
*G09G 3/3266* (2016.01)
*G11C 19/28* (2006.01)
*G09G 3/3233* (2016.01)

(52) U.S. Cl.
CPC ......... *G09G 3/3266* (2013.01); *G09G 3/3233* (2013.01); *G11C 19/28* (2013.01); *G09G 2310/0286* (2013.01)

(58) Field of Classification Search
CPC .............. G09G 3/3266; G09G 3/3677; G09G 2310/0286; G11C 19/28
See application file for complete search history.

(56) References Cited

U.S. PATENT DOCUMENTS

| | | | | |
|---|---|---|---|---|
| 11,200,861 B2* | 12/2021 | Yuan | ...................... | G11C 19/28 |
| 2019/0251887 A1* | 8/2019 | Xue | ...................... | G09G 3/3677 |
| 2020/0152283 A1* | 5/2020 | Qing | ...................... | G11C 19/28 |
| 2020/0294436 A1* | 9/2020 | Lai | ...................... | G09G 3/3674 |

* cited by examiner

*Primary Examiner* — Patrick O Neill
(74) *Attorney, Agent, or Firm* — Thomas | Horstemeyer LLP

(57) ABSTRACT

The present disclosure relates to the field of display technology, and provides a shift register unit and a driving method thereof, a gate driving circuit, and a display panel. The shift register unit includes: an input circuit, a charging circuit, an inverter circuit, an output circuit, and a pull-down circuit. The input circuit is connected to a second clock signal terminal, a signal input terminal and a first node. The inverter circuit is connected to the signal input terminal, the second clock signal terminal, a first power supply terminal, a second power supply terminal and a pull-down node. The output circuit is connected to the pull-up node, the first power supply terminal and an output terminal. The pull-down circuit is connected to the pull-down node, the second power supply terminal, the pull-up node, and the output terminal.

20 Claims, 9 Drawing Sheets

US 11,341,923 B2

SHIFT REGISTER UNIT, DRIVING METHOD THEREOF, GATE DRIVING CIRCUIT AND DISPLAY PANEL

CROSS-REFERENCE TO RELATED APPLICATION

This application claims the benefit of and priority to Chinese Patent Application No. 202010328861.8, filed on Apr. 23, 2020, the contents of which being incorporated by reference in their entirety herein.

TECHNICAL FIELD

The present disclosure relates to the field of display technology and, in particular, to a shift register unit, a driving method thereof, a gate driving circuit, and a display panel.

BACKGROUND

In the field of display technology, a gate driving circuit is generally used to provide a gate driving signal to a pixel driving circuit, and the gate driving signal can control on and off of switch transistors in the pixel driving circuit.

In some special situations, the gate driving circuit needs to adjust the effective duration of its output gate driving signal according to actual needs. However, the effective duration of the gate driving signal output by the gate driving circuit usually cannot be adjusted.

It should be noted that the information of the disclosure in the background is only used to enhance the understanding of the background of the disclosure, and therefore may include information that does not constitute the prior art known to those of ordinary skill in the art.

SUMMARY

The object of the present disclosure is to provide a shift register unit, a driving method thereof, a gate driving circuit, and a display panel. The shift register unit can adjust the effective duration of its output signal.

Other characteristics and advantages of the present disclosure will become apparent through the following detailed description, or partly learned through the practice of the present disclosure.

According to one aspect of the present disclosure, there is provided a shift register unit, including: an input circuit, connected to a second clock signal terminal, a signal input terminal and a first node, and configured to transmit a signal of the signal input terminal to the first node in response to a signal of the second clock signal terminal; a charging circuit, connected to the first node, a first clock signal terminal and a pull-up node, and configured to transmit a signal of the first clock signal terminal to the pull-up node in response to signals of the first node and the first clock signal terminal; an inverter circuit, connected to the signal input terminal, the second clock signal terminal, a first power supply terminal, a second power supply terminal and a pull-down node, and configured to transmit a signal of the second power supply terminal to the pull-down node in response to the signal of the signal input terminal, and transmit a signal of the first power supply terminal to the pull-down node in response to the signal of the second clock signal terminal; an output circuit, connected to the pull-up node, the first power supply terminal and an output terminal, and configured to transmit the signal of the first power supply terminal to the output terminal in response to a signal of the pull-up node; and a pull-down circuit, connected to the pull-down node, the second power supply terminal, the pull-up node and the output terminal, and configured to transmit the signal of the second power supply terminal to the pull-up node and the output terminal in response to a signal of the pull-down node.

In an exemplary embodiment of the present disclosure, the shift register unit further includes: a reset circuit, connected to the first power supply terminal, the pull-down node and a reset signal terminal, and configured to transmit the signal of the first power supply terminal to the pull-down node in response to a signal of the reset signal terminal.

In an exemplary embodiment of the present disclosure, the input circuit includes: a first switch transistor, having a first terminal connected to the signal input terminal, a second terminal connected to the first node, and a control terminal connected to the second clock signal terminal.

In an exemplary embodiment of the present disclosure, the charging circuit includes: a second switch transistor, having a first terminal connected to the first clock signal terminal, a second terminal connected to the second node, and a control terminal connected to the first node; a third switch transistor, having a first terminal connected to the second node, a second terminal connected to the pull-up node, and a control terminal connected to the first clock signal terminal; and a first capacitor, connected between the first node and the second node.

In an exemplary embodiment of the present disclosure, the inverter circuit includes: a fourth switch transistor, having a first terminal connected to the second clock signal terminal, and a control terminal connected to the first power supply terminal; a fifth switch transistor, having a first terminal connected to the first power supply terminal, a second terminal connected to the pull-down node, and a control terminal connected to a second terminal of the fourth switch transistor; a sixth switch transistor, having a first terminal connected to the second terminal of the fourth switch transistor, a second terminal connected to the second power supply terminal, and a control terminal connected to the signal input terminal; and a seventh switch transistor, having a first terminal connected to the pull-down node, a second terminal connected to the second power supply terminal, and a control terminal connected to the signal input terminal.

In an exemplary embodiment of the present disclosure, the output circuit includes: an eighth switch transistor, having a first terminal connected to the first power supply terminal, a second terminal connected to the output terminal, and a control terminal connected to the pull-up node; and a second capacitor, connected between the first power supply terminal and the pull-up node.

In an exemplary embodiment of the present disclosure, the pull-down circuit includes: a ninth switch transistor, having a first terminal connected to the pull-up node, a second terminal connected to the second power supply terminal, and a control terminal connected to the pull-down node; a tenth switch transistor, having a first terminal connected to the second power supply terminal, a second terminal connected to the output terminal, and a control terminal connected to the pull-down node; and a third capacitor, connected between the pull-down node and the second power supply terminal.

In an exemplary embodiment of the present disclosure, the reset circuit includes: an eleventh switch transistor, having a first terminal connected to the first power supply terminal, a second terminal connected to the pull-down node, and a control terminal connected to the reset signal terminal.

According to one aspect of the present disclosure, there is provided a driving method of a shift register unit, for driving the shift register unit described above, wherein the driving method includes a first pull-down stage, a first shift stage, a charging stage, an output stage, a holding stage, a second shift stage, and a second pull-down stage sequentially according to a time sequence, wherein, in the first pull-down stage, a turn-off signal is input to the signal input terminal and the first clock signal terminal, and a turn-on signal is input to the second clock signal terminal;

in the first shift stage, a turn-off signal is input to the signal input terminal and the second clock signal terminal, and a turn-on signal is input to the first clock signal terminal;

in the charging stage, a turn-off signal is input to the first clock signal terminal, and a turn-on signal is input to the signal input terminal and the second clock signal terminal;

in the output stage, a turn-off signal is input to the second clock signal terminal, and a turn-on signal is input to the signal input terminal and the first clock signal terminal;

in the holding stage, a turn-off signal is input to the first clock signal terminal, and a turn-on signal is input to the second clock signal terminal and the signal input terminal;

in the second shift stage, a turn-off signal is input to the signal input terminal and the second clock signal terminal, and a turn-on signal is input to the first clock signal terminal; and in the second pull-down stage, a turn-off signal is input to the signal input terminal and the first clock signal terminal, and a turn-on signal is input to the second clock signal terminal.

In an exemplary embodiment of the present disclosure, the driving method includes a plurality of the charging stages and a plurality of the output stages; the plurality of charging stages and the plurality of output stages are located between the first shift stage and the holding stage according to a time sequence, and the charging stage and the output stage are sequentially spaced apart according to a time sequence.

According to one aspect of the present disclosure, there is provided a gate driving circuit, including: a plurality of shift register units described above, wherein the shift register units are arranged in cascade; a first clock signal line, connected to first clock signal terminals of shift register units of odd-numbered stages and second clock signal terminals of shift register units of even-numbered stages; and a second clock signal line, connected to second clock signal terminals of shift register unit of odd-numbered stage and first clock signal terminals of shift register units of even-numbered stages.

According to one aspect of the present disclosure, there is provided a display panel, including the gate driving circuit described above.

The present disclosure provides a shift register unit, a driving method thereof, a gate driving circuit, and a display panel. The shift register unit, includes: an input circuit, connected to a second clock signal terminal, a signal input terminal and a first node, and configured to transmit a signal of the signal input terminal to the first node in response to a signal of the second clock signal terminal; a charging circuit, connected to the first node, a first clock signal terminal and a pull-up node, and configured to transmit a signal of the first clock signal terminal to the pull-up node in response to signals of the first node and the first clock signal terminal; an inverter circuit, connected to the signal input terminal, the second clock signal terminal, a first power supply terminal, a second power supply terminal and a pull-down node, and configured to transmit a signal of the second power supply terminal to the pull-down node in response to the signal of the signal input terminal, and transmit a signal of the first power supply terminal to the pull-down node in response to the signal of the second clock signal terminal; an output circuit, connected to the pull-up node, the first power supply terminal and an output terminal, and configured to transmit the signal of the first power supply terminal to the output terminal in response to a signal of the pull-up node; and a pull-down circuit, connected to the pull-down node, the second power supply terminal, the pull-up node and the output terminal, and configured to transmit the signal of the second power supply terminal to the pull-up node and the output terminal in response to a signal of the pull-down node. On the one hand, the shift register unit can adjust a duration of a valid signal at the output terminal by adjusting a duration of a valid signal at the input terminal; on the other hand, a structure of the shift register unit is simple.

It should be understood that the above general description and the following detailed description are only exemplary and explanatory, and cannot limit the present disclosure.

BRIEF DESCRIPTION OF THE DRAWINGS

The drawings here are incorporated into the specification and constitute a part of the specification, show embodiments in accordance with the present disclosure, and explain the principle of the present disclosure together with the specification. The drawings in the following description are only some embodiments of the present disclosure. For those of ordinary skill in the art, other drawings can be obtained based on these drawings without creative work.

DETAILED DESCRIPTION

Figure 1:
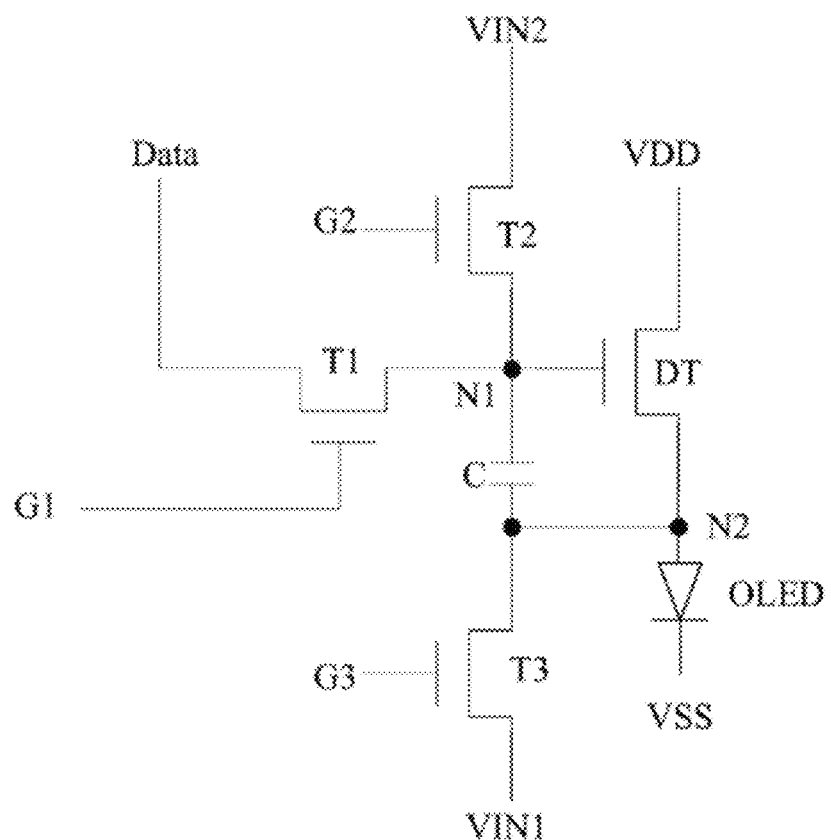
FIG. 1 is a schematic structural diagram of a pixel driving circuit in the related art.

Example embodiments will now be described more fully with reference to the accompanying drawings. However, the example embodiments can be implemented in various forms, and should not be construed as being limited to the examples set forth herein. On the contrary, the provision of these embodiments makes the present disclosure more comprehensive and complete, and fully conveys the concept of the example embodiments to those skilled in the art. The same reference numerals in the figures indicate the same or similar structures, and thus their detailed descriptions will be omitted.

Although relative terms such as "upper" and "lower" are used in this specification to describe the relative relationship between one component of an icon and another component, these terms are used in this specification only for convenience, for example, the example direction as shown in the drawings. It can be understood that if the apparatus of the icon is turned upside down, the component described as "upper" will become the "lower" component. Other relative terms, such as "high", "low", "top", "bottom", "left" and "right" have similar meanings. When a structure is "on" another structure, it may mean that a certain structure is integrally formed on other structures, or that a certain structure is "directly" installed on other structures, or that a certain structure is "indirectly" installed on other structures through another structure.

The terms "a", "an" and "the" are used to indicate the presence of one or more elements, components, etc. The terms "including" and "having" are used to indicate open-ended inclusion and mean that there may be additional elements, components, etc. in addition to the listed elements, components, etc.

Figure 2:
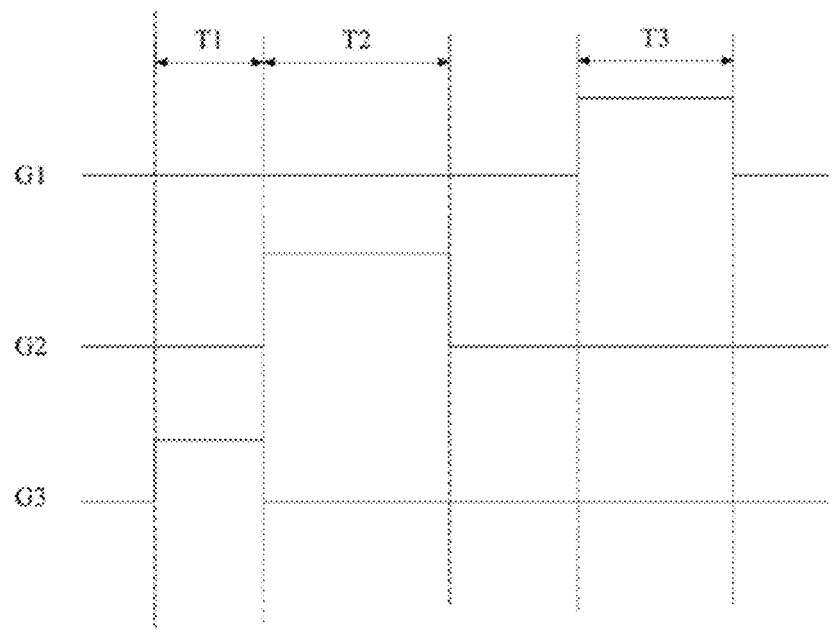
FIG. 2 is a timing diagram of each node in a driving method of the pixel driving circuit in FIG. 1.

In the field of display technology, a gate driving circuit is generally used to provide a gate driving signal to the pixel driving circuit, and the gate driving signal can control on and off of switch transistors in the pixel driving circuit. In some special cases, the gate driving circuit needs to adjust the effective duration of its output gate driving signal according to actual needs. For example, as shown in FIG. 1, a schematic structural diagram of a pixel driving circuit in the related art is shown. The pixel driving circuit includes a first switch transistor T1, a second switch transistor T2, a third switch transistor T3, a driving transistor DT, a capacitor C, and a light emitting unit OLED. In the embodiment, a first terminal of the first switch transistor T1 is connected to a data signal terminal Data, a second terminal thereof is connected to a first node N1, and a control terminal thereof is connected to a first control terminal G1. A first terminal of the second switch transistor T2 is connected to a second signal terminal VIN2, a second terminal thereof is connected to the first node N1, and a control terminal thereof is connected to a second control terminal G2. A first terminal of the third switch transistor T3 is connected to a second node, a second terminal thereof is connected to a first signal terminal VIN1, and a control terminal thereof is connected to a third control terminal G3. The capacitor C is connected between the first node N1 and the second node N2. A first terminal of the driving transistor DT is connected to a first power supply terminal VDD, a second terminal thereof is connected to the second node N2, and a control terminal thereof is connected to the first node N1. The light emitting unit OLED is connected to between the second node N2 and a second power supply terminal VSS. As shown in FIG. 2, a timing diagram is shown of each node in a driving method of the pixel driving circuit in FIG. 1. The driving method of the pixel driving circuit includes three stages: a reset stage T1, a threshold writing stage T2, and a light emitting stage T3. In the reset stage T1, the third control terminal G3 outputs a high level signal to turn on the third switch transistor T3, and the first signal terminal VIN1 inputs a reset signal to the second node N2. In the threshold writing stage T2, the second control terminal G2 outputs a high level signal to turn on the second switch transistor T2, and the second signal terminal VIN2 writes a reference voltage signal to the first node N1. At this time, the driving transistor DT is turned on, and the first power supply terminal VDD charges the second node N2. A voltage of the second nodes N2 gradually increases until it reaches Vref−V2=Vth, where Vref is a voltage of a reference voltage signal, V2 is a voltage of the second node, and Vth is a threshold voltage of the driving transistor DT. In the light emitting stage, the first control terminal G1 inputs a high level signal to turn on the first switch transistor T1, and the data signal terminal Data writes a data signal to the first node. At this time, the driving current I output by the driving transistor DT is $(\mu W C_{ox}/2L)(V_{gs}-V_{th})^2$, where $\mu$ is the carrier mobility; $C_{ox}$ is the gate capacitance per unit area, W is a width of a channel of the driving transistor, L is a length of a channel of the driving transistor, Vgs is a gate-source voltage difference of the driving transistor, and Vth is the threshold voltage of the driving transistor. The driving current I output by the driving transistor DT is $(\mu W C_{ox}/2L)(V_{data}-V_{ref}+V_{th}-V_{th})^2$, so the pixel driving circuit can eliminate the display uniformity caused by different threshold voltages of driving transistors in different pixel driving circuits in the display panel. In the embodiment, in the threshold writing stage T2, the threshold voltage of the driving transistor needs to be fully written to the second node. Therefore, the duration of the threshold writing stage T2 is related to the threshold voltage of the driving transistor. When the display panel is used for a long time, the threshold of the driving transistor in the pixel driving circuit drifts. Therefore, the threshold writing stage T2 should be adjusted accordingly. The pixel driving circuit usually provides a driving signal to the second control terminal G2 through a gate driving circuit, and the gate driving circuit needs to adjust the effective duration of its output gate driving signal according to actual needs.

Figure 3:
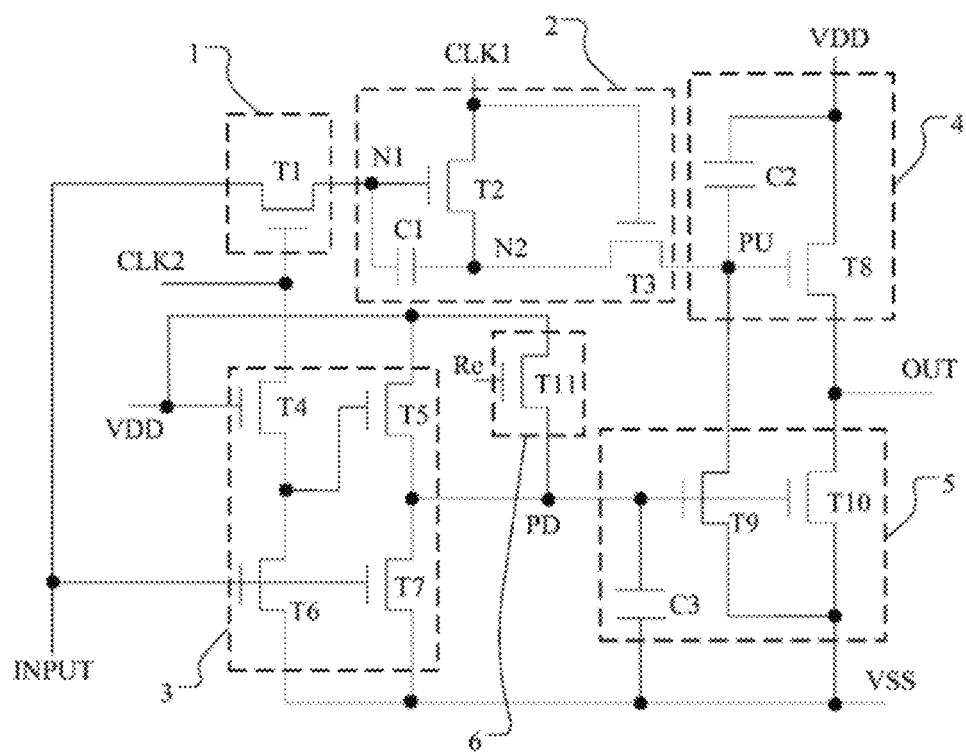
FIG. 3 is a schematic structural diagram of an exemplary embodiment of the shift register unit of the present disclosure.

Based on this, the exemplary embodiment provides a shift register unit, as shown in FIG. 3, which is a schematic structural diagram of an exemplary embodiment of the shift register unit of the present disclosure. The shift register unit includes: an input circuit 1, a charging circuit 2, an inverter circuit 3, an output circuit 4, and a pull-down circuit 5. The input circuit 1 is connected to a second clock signal terminal CLK2, a signal input terminal INPUT and a first node N1, and configured to transmit a signal of the signal input terminal INPUT to the first node N1 in response to a signal of the second clock signal terminal CLK2. The charging circuit 2 is connected to the first node N1, a first clock signal terminal CLK1 and a pull-up node PU, and configured to transmit a signal of the first clock signal terminal CLK1 to the pull-up node PU in response to signals of the first node N1 and the first clock signal terminal CLK1. The inverter circuit 3 is connected to the signal input terminal INPUT, the second clock signal terminal CLK2, a first power supply terminal VDD, a second power supply terminal VSS and a pull-down node PD, and configured to transmit a signal of the second power supply terminal VSS to the pull-down node PD in response to the signal of the signal input terminal INPUT, and transmit a signal of the first power supply terminal VDD to the pull-down node PD in response to the signal of the second clock signal terminal CLK2. The output circuit 4 is connected to the pull-up node PU, the first power supply terminal VDD and an output terminal OUT, and configured to transmit the signal of the first power supply terminal VDD to the output terminal OUT in response to a signal of the pull-up node PU. The pull-down circuit 5 is connected to the pull-down node PD, the second power supply terminal VSS, the pull-up node PU and the output terminal OUT, and configured to transmit the signal of the second power supply terminal VSS to the pull-up node PU and the output terminal OUT in response to a signal of the pull-down node PD.

In this exemplary embodiment, the shift register unit may further include a reset circuit 6. The reset circuit 6 is connected to the first power supply terminal VDD, the pull-down node PD, and a reset signal terminal Re, and configured to transmit the signal of the first power supply terminal VDD to the pull-down node PD in response to a signal of the reset signal terminal Re.

In this exemplary embodiment, as shown in FIG. 3, the input circuit 1 may include a first switch transistor T1. A first terminal of the first switch transistor T1 is connected to the signal input terminal INPUT, a second terminal thereof is connected to the first node N1, and a control terminal thereof is connected to the second clock signal terminal CLK2. The charging circuit 2 may include a second switch transistor T2, a third switch transistor T3, and a first capacitor C1. A first terminal of the second switch transistor T2 is connected to the first clock signal terminal CLK1, a second terminal thereof is connected to the second node N2, and a control terminal thereof is connected to the first node N1. A first terminal of the third switch transistor T3 is connected to the second node N2, a second terminal thereof is connected to the pull-up node PU, and a control terminal thereof is connected to the first clock signal terminal CLK1. The first capacitor C1 is connected between the first node N1 and the second node N2. The inverter circuit 3 may include: a fourth switch transistor T4, a fifth switch transistor T5, a sixth switch transistor T6, and a seventh switch transistor T7. A first terminal of the fourth switch transistor T4 is connected to the second clock signal terminal CLK2, and a control terminal thereof is connected to the first power supply terminal VDD. A first terminal of the fifth switch transistor T5 is connected to the first power supply terminal VDD, a second terminal thereof is connected to the pull-down node PD, and a control terminal thereof is connected to a second terminal of the fourth switch transistor. A first terminal of the sixth switch transistor T6 is connected to the second terminal of the fourth switch transistor, a second terminal thereof is connected to the second power supply terminal VSS, and a control terminal thereof is connected to the signal input terminal INPUT. A first terminal of the seventh switch transistor T7 is connected to the pull-down node PD, a second terminal thereof is connected to the second power supply terminal VSS, and a control terminal thereof is connected to the signal input terminal INPUT. The output circuit 4 may include: an eighth switch transistor T8 and a second capacitor C2. A first terminal of the eighth switch transistor T8 is connected to the first power supply terminal VDD, a second terminal thereof is connected to the output terminal OUT, and a control terminal thereof is connected to the pull-up node PU. The second capacitor C2 is connected between the first power supply terminal VDD and the pull-up node PU. The pull-down circuit 5 may include: a ninth switch transistor T9, a tenth switch transistor T10, and a third capacitor C3. A first terminal of the ninth switch transistor T9 is connected to the pull-up node PU, a second terminal thereof is connected to the second power supply terminal VSS, and a control terminal thereof is connected to the pull-down node PD. A first terminal of the tenth switch transistor T10 is connected to the second power supply terminal VSS, a second terminal thereof is connected to the output terminal OUT, and a control terminal thereof is connected to the pull-down node PD. The third capacitor is connected between the pull-down node PD and the second power supply terminal VSS. The reset circuit 6 may include an eleventh switch transistor T11. A first terminal of the eleventh switch transistor T11 is connected to the first power supply terminal VDD, a second terminal thereof is connected to the pull-down node PD, and a control terminal thereof is connected to the reset signal terminal Re.

It should be understood that in other exemplary embodiments, the input circuit 1, the charging circuit 2, the inverter circuit 3, the output circuit 4, the pull-down circuit 5, and the reset circuit 6 may have more structures for selection, which all belong to the protection scope of the present disclosure.

Figure 4:
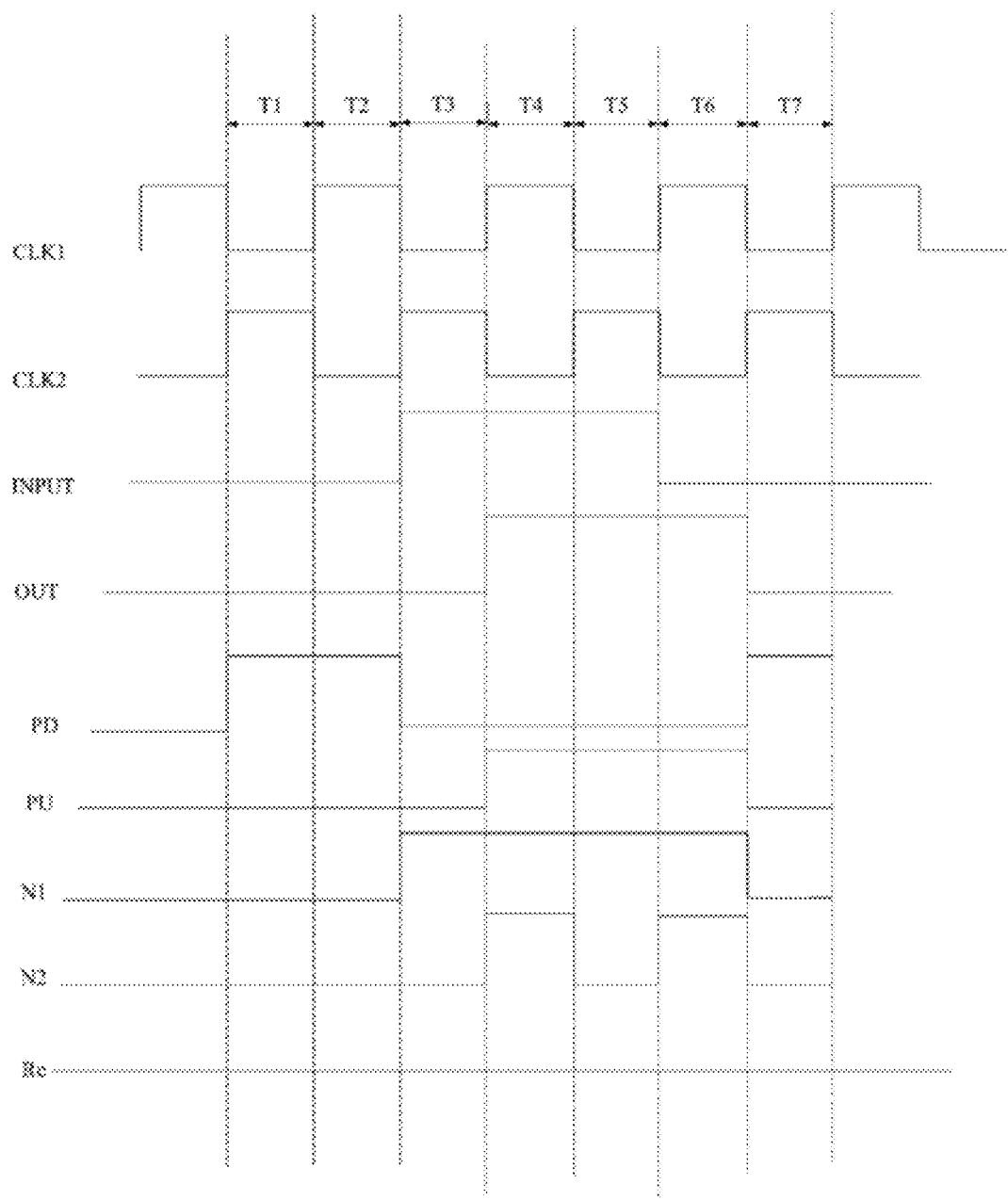
FIG. 4 is a timing diagram of each node in an exemplary driving method of the shift register unit in FIG. 3.

In this exemplary embodiment, as shown in FIG. 3, the first switch transistor T1 to the eleventh switch transistor T11 and the driving transistor DT may be N-type transistors. As shown in FIG. 4, it is a timing diagram of each node in an exemplary driving method of the shift register unit in FIG. 3. The first power supply terminal VDD may maintain a high level, and the second power supply terminal VSS may maintain a low level. The driving method of the shift register unit may include a first pull-down stage T1, a first shift stage T2, a charging stage T3, an output stage T4, a holding stage T5, a second shift stage T6, and a second pull-down stage T7 sequentially according to a time sequence.

Figure 5:
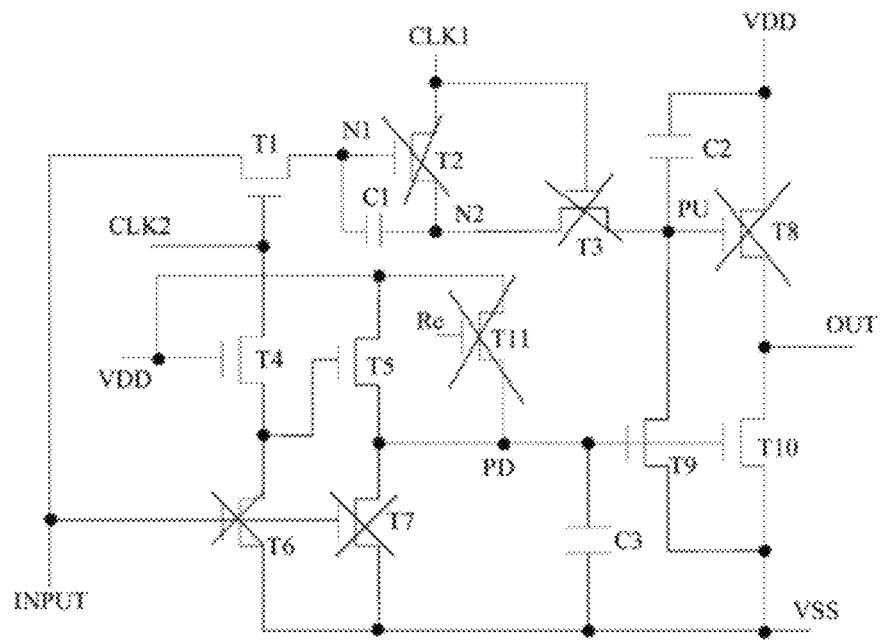
FIG. 5 is a schematic diagram of the state structure of the shift register unit in the first pull-down stage of the present disclosure.

In the embodiment, as shown in FIG. 5, it is a schematic diagram of the state structure of the shift register unit in the first pull-down stage of the present disclosure. The switch transistor with a cross indicates that it is in an off state, and the switch transistor without a cross indicates that it is in an on state. In the first pull-down stage T1, a turn-off signal (i.e., a low level signal) is input to the signal input terminal INPUT, the first clock signal terminal CLK1 and the reset signal terminal Re, and a turn-on signal (i.e., a high level signal) is input to the second clock signal terminal CLK2. At this time, the fourth switch transistor T4 is turned on under the action of the first power supply terminal VDD, and the high level signal of the second clock signal terminal CLK2 is transmitted to the control terminal of the fifth switch transistor T5 through the fourth switch transistor T4, thereby turning on the fifth switch transistor T5. The high level signal of the first power supply terminal VDD is transmitted to the pull-down node PD through the fifth switch transistor T5, the tenth switch transistor T10 is turned on under the action of the pull-down node. The low level signal of the second power supply VSS is transmitted to the output terminal OUT through the tenth switch transistor T10. At this time, the output terminal OUT outputs a low level signal, while the first switch transistor T1 is turned on, and the low level signal at the signal input terminal is transmitted to the first node N1 through the first switch transistor T1, the ninth switch transistor T9 is turned on, and the low level signal of the second power supply terminal VSS is transmitted to the pull-up node PU through the ninth switch transistor T9.

Figure 6:
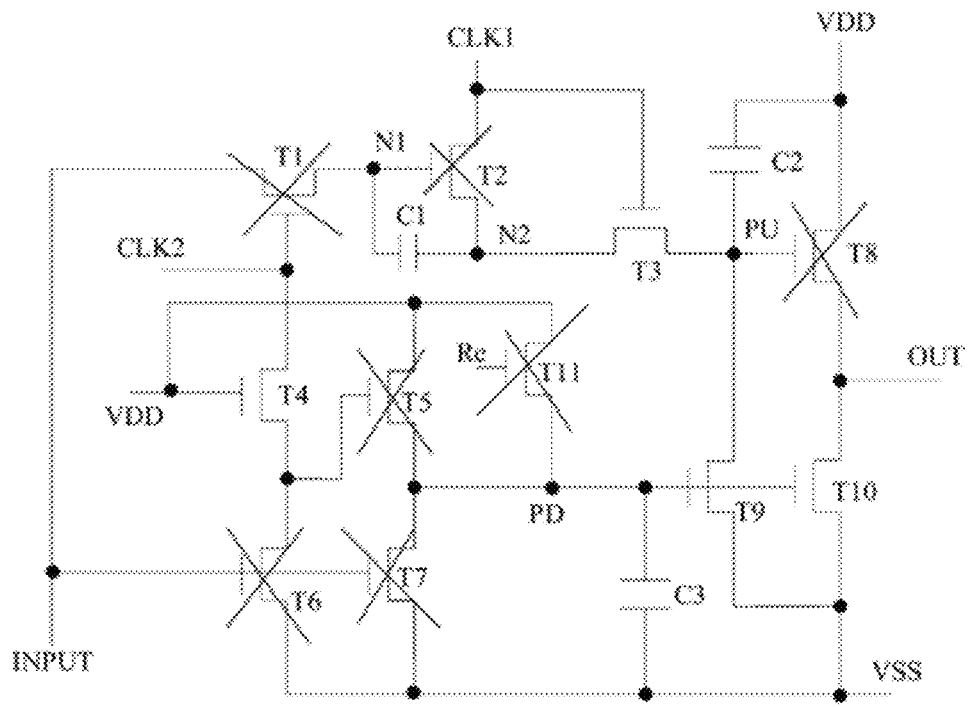
FIG. 6 is a schematic diagram of the state structure of the shift register unit in the first shift stage of the present disclosure.

As shown in FIG. 6, it is a schematic diagram of the state structure of the shift register unit in the first shift stage of the present disclosure. In the embodiment, the switch transistor with a cross indicates that it is in the off state, and the switch transistor without a cross indicates that it is in the on state. In the first shift stage T2, a turn-off signal is input to the signal input terminal INPUT, the second clock signal terminal CLK2 and the reset signal terminal Re, and a turn-on signal is input to the first clock signal terminal CLK1. The pull-down node PD maintains a high level signal under the action of the third capacitor C3. The ninth switch transistor T9 and the tenth switch transistor T10 are turned on. The low level signal of the second power supply terminal VSS is transmitted to the output terminal OUT, the output terminal OUT outputs a low level signal. At the same time, the low level signal of the second power supply terminal VSS is transmitted to the pull-up node PU through the ninth switch transistor T9, and the first node N1 maintains a low level under the action of the first capacitor C1.

Figure 7:
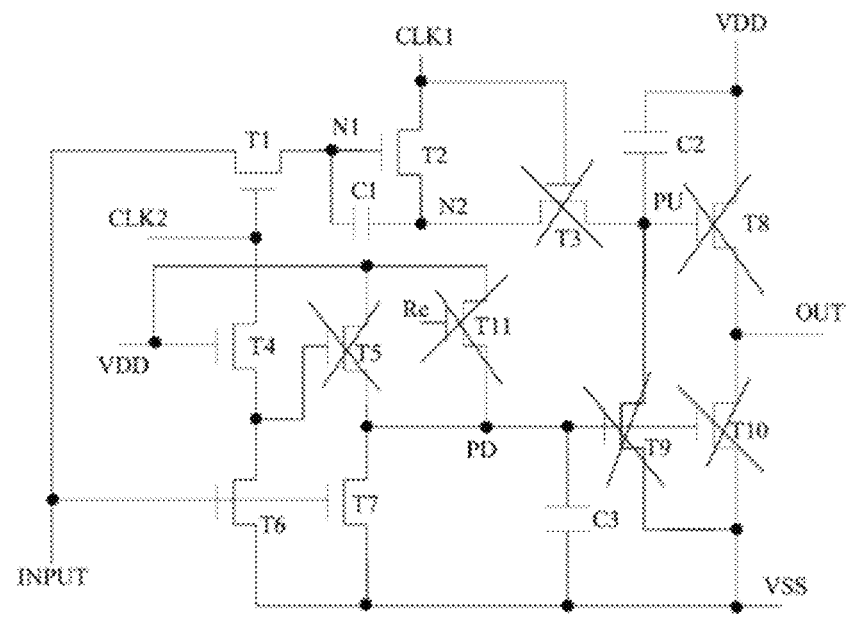
FIG. 7 is a schematic diagram of the state structure of the shift register unit in the charging stage of the present disclosure.

As shown in FIG. 7, it is a schematic diagram of the state structure of the shift register unit in the charging stage of the present disclosure. In the embodiment, the switch transistor with a cross indicates that it is in the off state, and the switch transistor without a cross indicates that it is in the on state. In the charging stage T3, a turn-off signal is input to the first clock signal terminal CLK1 and the reset signal terminal Re, and a turn-on signal is input to the signal input terminal INPUT and the second clock signal terminal CLK2. The seventh switch transistor T7 is turned on. The low level signal of the second power supply terminal VSS is transmitted to the pull-down node through the seventh switch transistor T7. The ninth switch transistor T9 and the tenth switch transistor T10 are turned off under the action of the pull-down node, and the output terminal OUT maintains the low level of the previous stage. At the same time, the first switch transistor T1 is turned on. The high level of the signal input terminal INPUT is transmitted to the first node N1 through the first switch transistor T1. The second switch transistor T2 is turned on, and the low level signal of the first clock signal terminal CLK1 is transmitted to the second node N2 through the second switch transistor T2.

Figure 8:
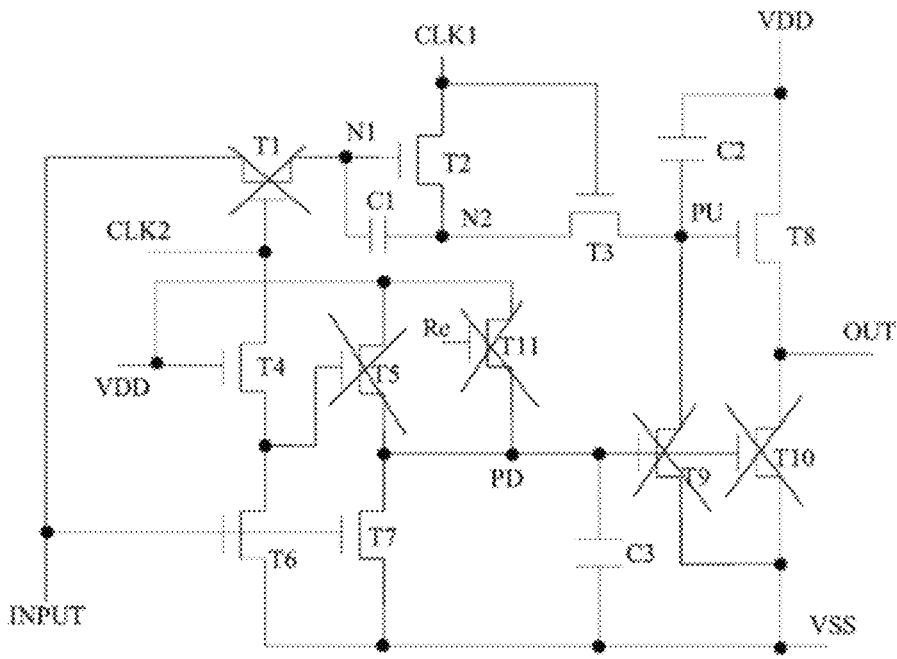
FIG. 8 is a schematic diagram of the state structure of the shift register unit in the output stage of the present disclosure.

As shown in FIG. 8, it is a schematic diagram of the state structure of the shift register unit in the output stage of the present disclosure. In the embodiment, the switch transistor with a cross indicates that it is in the off state, and the switch transistor without a cross indicates that it is in the on state. In the output stage T4, a turn-off signal is input to the second clock signal terminal CLK2 and the reset signal terminal Re, and a turn-on signal is input to the signal input terminal INPUT and the first clock signal terminal CLK1. The seventh switch transistor T7 is turned on. The low level of the second power supply terminal VSS is written into the pull-down node PD through the seventh switch transistor T7, and the ninth switch transistor T9 and the tenth switch transistor T10 are turned off. The first switch transistor T1 is turned off, the first node N1 maintains a high level signal under the action of the first capacitor C1. The second switch transistor T2 is turned on, and the high level signal of the first clock signal terminal CLK1 is transmitted to the second node N2 through the second switch transistor T2. The third switch transistor T3 is turned on, the high level signal of the second node N2 is transmitted to the pull-up node PU through the third switch transistor T3. The eighth switch transistor T8 is turned on under the action of the pull-up node PU, and the high level signal of the first power supply terminal VDD is transmitted to the output terminal OUT through the eighth switch transistor T8.

Figure 9:
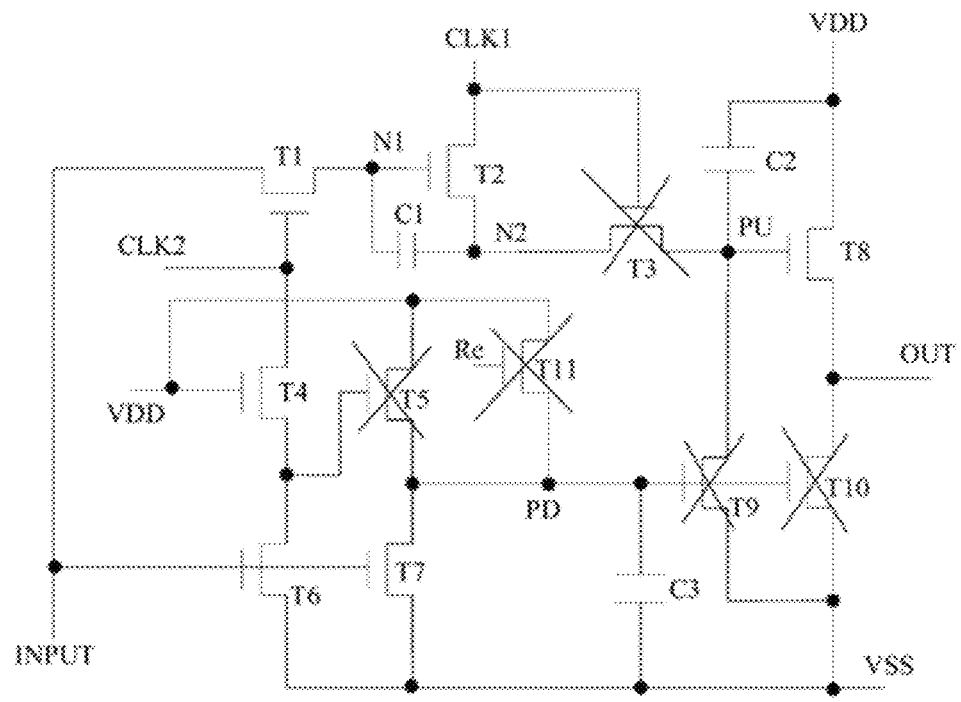
FIG. 9 is a schematic diagram of the state structure of the shift register unit in the holding stage of the present disclosure.

As shown in FIG. 9, it is a schematic diagram of the state structure of the shift register unit in the holding stage of the present disclosure. In the embodiment, the switch transistor with a cross indicates that it is in the off state, and the switch transistor without a cross indicates that it is in the on state. In the holding stage T5, a turn-off signal is input to the first clock signal terminal CLK1 and the reset signal terminal Re, and a turn-on signal is input to the second clock signal terminal CLK2 and the signal input terminal INPUT. The seventh switch transistor T7 is turned on, the low level of the second power supply terminal VSS is written into the pull-down node PD through the seventh switch transistor T7, and the ninth switch transistor T9 and the tenth switch transistor T10 are turned off. The first switch transistor T1 is turned on, and the high level of the signal input terminal INPUT is written into the first node N1 through the first switch transistor T1. The second switch transistor T2 is turned on, and the low level signal of the first clock signal terminal CLK1 is transmitted to the second node N2 through the second switch transistor T2. The third switch transistor T3 is turned off, the pull-up node PU maintains a high level under the action of the second capacitor C2. The eighth switch transistor T8 is turned on, and the first power supply terminal VDD outputs a high level to the output terminal OUT through the eighth switch transistor T8.

Figure 10:
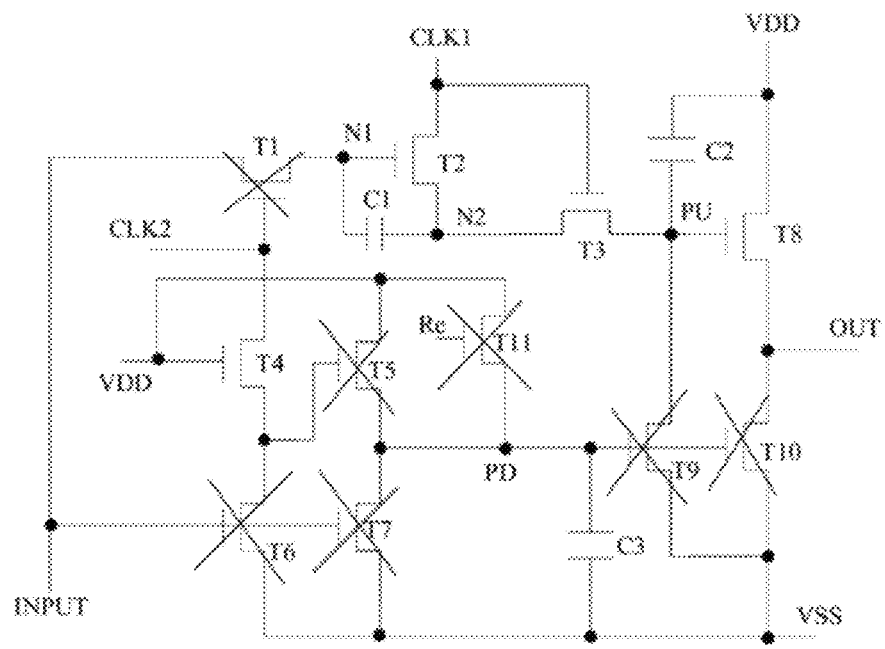
FIG. 10 is a schematic diagram of the state structure of the shift register unit in the second shift stage of the present disclosure.

As shown in FIG. 10, it is a schematic diagram of the state structure of the shift register unit in the second shift stage of the present disclosure. In the embodiment, the switch transistor with a cross indicates that it is in the off state, and the switch transistor without a cross indicates that it is in the on state. In the second shift stage T6, a turn-off signal is input to the signal input terminal INPUT, the second clock signal terminal CLK2 and the reset signal terminal Re, and a turn-on signal is input to the first clock signal terminal CLK1. The seventh switch transistor T7 and the fifth switch transistor T5 are turned off. The pull-down node PD maintains a low level under the action of the third capacitor C3. The ninth switch transistor T9 and the tenth switch transistor T10 are turned off. The first switch transistor T1 is turned off, and the first node N1 maintains a high level under the action of the first capacitor C1. The second switch transistor T2 is turned on, the high level of the first clock signal terminal CLK1 is transmitted to the second node N2 through the second switch transistor T2. The third switch transistor T3 is turned on, and the high level of the second node N2 is transmitted to the pull-up node PU. The eighth switch transistor T8 is turned on, and the high level of the first power supply terminal VDD is transmitted to the output terminal OUT through the eighth switch transistor T8.

Figure 11:
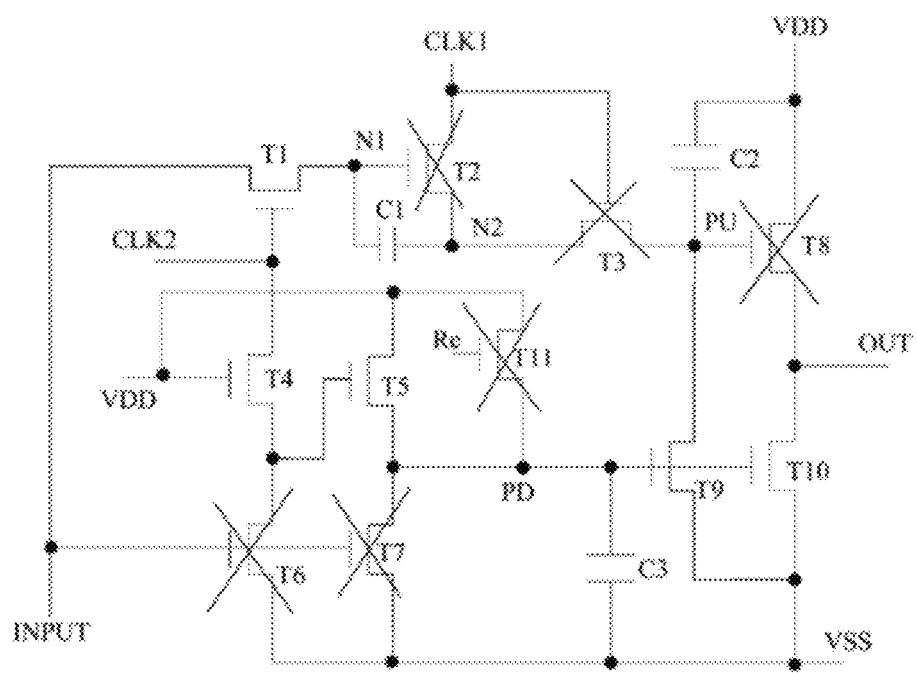
FIG. 11 is a schematic diagram of the state structure of the shift register unit in the second pull-down stage of the present disclosure.

As shown in FIG. 11, it is a schematic diagram of the state structure of the shift register unit in the second pull-down stage of the present disclosure. In the embodiment, the switch transistor with a cross indicates that it is in the off state, and the switch transistor without a cross indicates that it is in the on state. In the second pull-down stage T7, a turn-off signal is input to the signal input terminal INPUT, the first clock signal terminal CLK1 and the reset signal terminal Re, and a turn-on signal is input to the second clock signal terminal CLK2. The fifth switch transistor T5 is turned on under the action of the high level of the second clock signal terminal CLK2. The first power supply terminal VDD inputs a high level signal to the pull-down node PD. The ninth switch transistor T9 and the tenth switch transistor T10 are turned on. The low level signal of the second power supply terminal VSS is transmitted to the output terminal OUT through the tenth switch transistor T10, and the low level signal of the second power supply terminal VSS is transmitted to the pull-up node PU through the ninth switch transistor T9, thereby the eighth switch transistor T8 is turned off. The first switch transistor T1 is turned on, the low level signal of the signal input terminal INPUT is transmitted to the first node N1, and the voltage of the second node N2 drops simultaneously with the first node under the bootstrap action of the first capacitor C1.

In addition, the reset signal terminal is used to input a high level signal at the end or the beginning of a frame to turn on the eleventh switch transistor T11, so that the output terminal OUT is reset to a low level.

Figure 12:
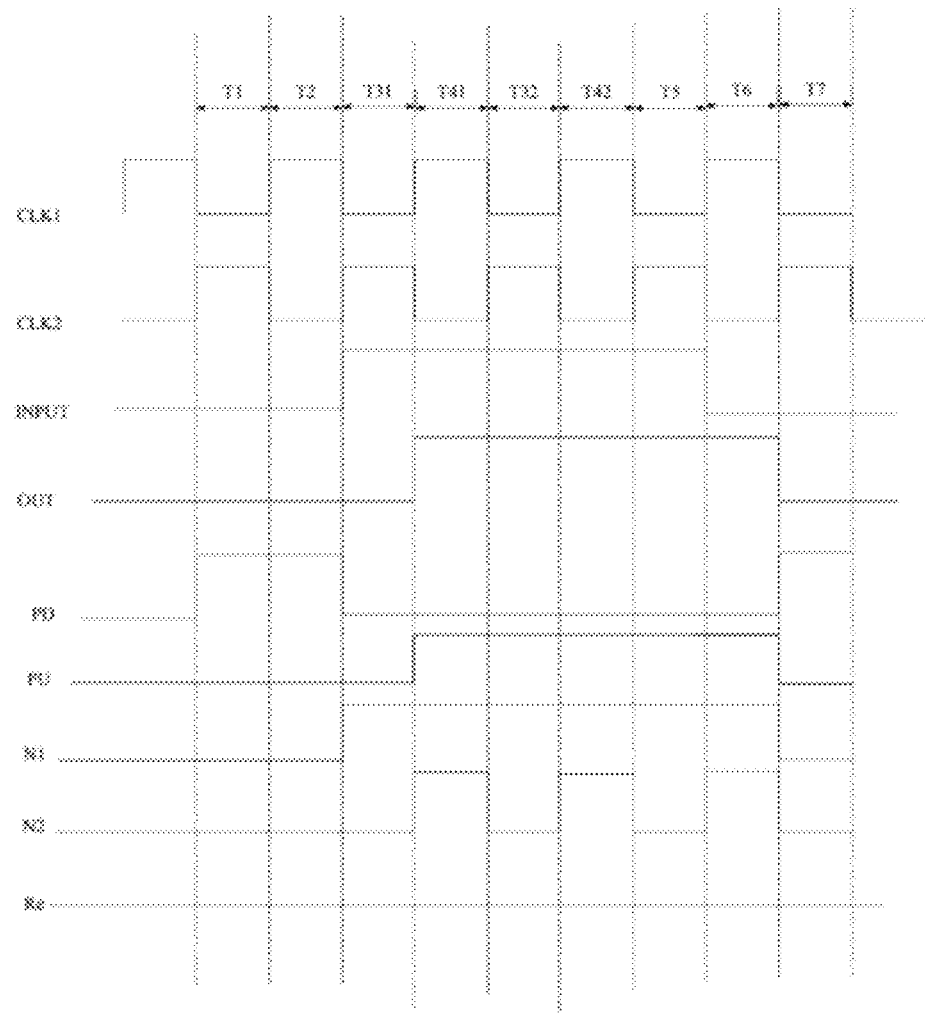
FIG. 12 is a timing diagram of each node in another exemplary driving method of the shift register unit in FIG. 3.

In this exemplary embodiment, the driving method may include a plurality of the charging stages and a plurality of the output stages; the plurality of charging stages and the plurality of output stages are located between the first shift stage and the holding stage according to a time sequence, and the charging stage and the output stage are sequentially spaced apart according to a time sequence. By setting the number of charging stages and output stages, the duration of outputting a high level by the output terminal can be adjusted. For example, as shown in FIG. 12, it is a timing diagram of each node in another exemplary driving method of the shift register unit in FIG. 3. The driving method may include: a first pull-down stage T1, a first shift stage T2, a first charging stage T31, a first output stage T41, a second charging stage T32, a second output stage T42, and a holding stage T5. The second shift stage T6, and the second pull-down stage T7 are sequential according to a time sequence. The driving method adjusts the high level duration of the output terminal by setting two charging stages and two output stages.

In the embodiment, in the first pull-down stage, a turn-off signal is input to the signal input terminal and the first clock signal terminal, and a turn-on signal is input to the second clock signal terminal; in the first shift stage, a turn-off signal is input to the signal input terminal and the second clock signal terminal, and a turn-on signal is input to the first clock signal terminal; in the first charging stage, a turn-off signal is input to the first clock signal terminal, and a turn-on signal is input to the signal input terminal and the second clock signal terminal; in the first output stage, a turn-off signal is input to the second clock signal terminal, and a turn-on signal is input to the signal input terminal and the first clock signal terminal; in the second charging stage, a turn-off signal is input to the first clock signal terminal, and a turn-on signal is input to the signal input terminal and the second clock signal terminal; in the second output stage, a turn-off signal is input to the second clock signal terminal, and a turn-on signal is input to the signal input terminal and the first clock signal terminal; in the holding stage, a turn-off signal is input to the first clock signal terminal, and a turn-on signal is input to the second clock signal terminal and the signal input terminal; in the second shift stage, a turn-off signal is input to the signal input terminal and the second clock signal terminal, and a turn-on signal is input to the first clock signal terminal; and in the second pull-down stage, a turn-off signal is input to the signal input terminal and the first clock signal terminal, and a turn-on signal is input to the second clock signal terminal. As shown in FIG. 12, compared with FIG. 4, the high level periods of the output terminal changes from T4, T5, T6 to T41, T32, T42, T5, and T6.

It should be understood that, in other exemplary embodiments, the first to eleventh switch transistors and the driving transistors may also be P-type transistors. Correspondingly, the turn-on signal is a low level signal, and the turn-off signal is a high level signal.

On the one hand, the shift register unit provided by the present disclosure can adjust a duration of a valid signal at the output terminal by adjusting a duration of a valid signal at the input terminal; on the other hand, a structure of the shift register unit is simple.

Figure 13:
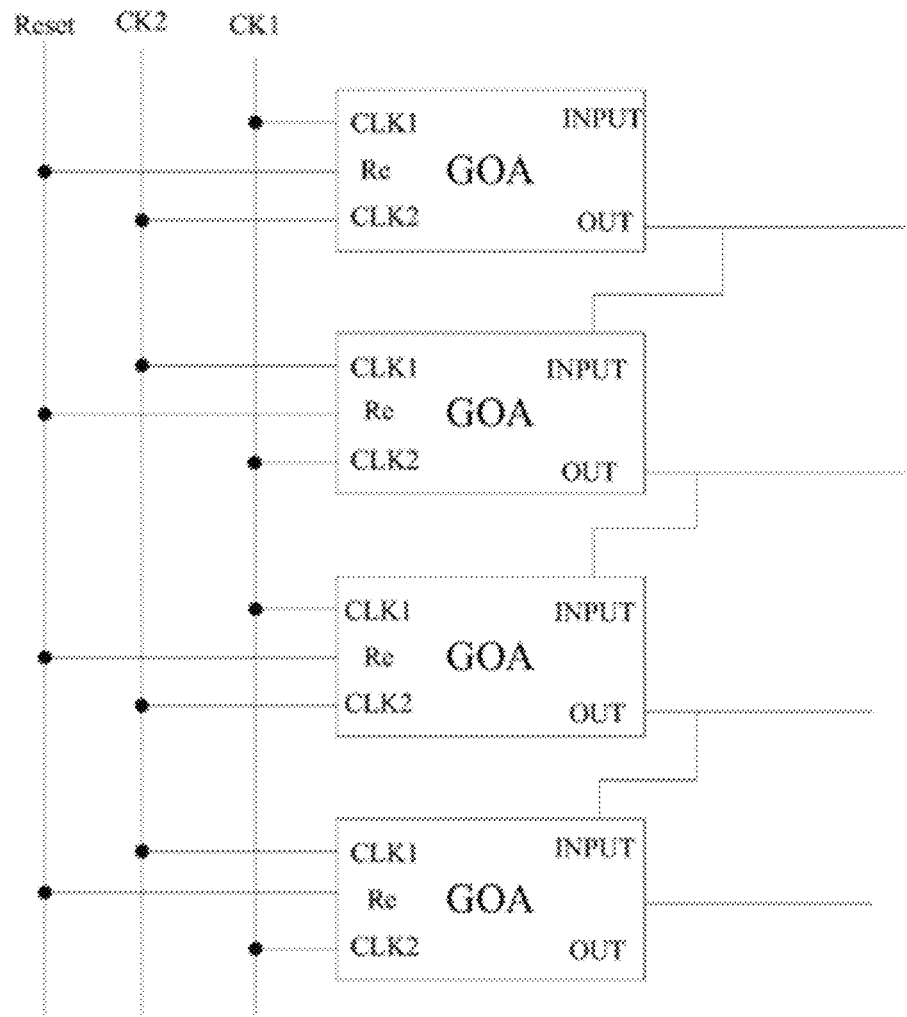
FIG. 13 is a schematic structural diagram of an exemplary embodiment of the gate driving circuit of the present disclosure.

The exemplary embodiment further provides a gate driving circuit, as shown in FIG. 13, which a schematic structural diagram of an exemplary embodiment of the gate driving circuit of the present disclosure. The gate driving circuit includes: a plurality of shift register units GOA described above, a first clock signal line CK1 and a second clock signal line CK2. The shift register units are arranged in cascade, and an output terminal OUT of the shift register unit of a previous stage is connected to a signal input terminal INPUT of the shift register unit of a next stage. The first clock signal line CK1 is connected to first clock signal terminals CLK1 of shift register units of odd-numbered stages and second clock signal terminals CLK2 of shift register units of even-numbered stages. The second clock signal line CK2 is connected to second clock signal terminals CLK2 of shift register unit of odd-numbered stage and first clock signal terminals CLK1 of shift register units of even-numbered stages. As can be seen in conjunction with FIGS. 4 and 13, the output stage of the shift register unit of one stage is the charging stage of the shift register unit of the next stage. However, the logic level of the first clock signal terminal is opposite in the charging stage and the output stage of the shift register unit, and the logic level of the second clock signal terminal is opposite in the charging stage and the output stage of the shift register unit. In order to enable the output stage of the shift register unit of one stage to be used as the charging stage of the shift register unit of the next stage, considering that the signals of the first clock signal terminal and the second clock signal terminal are exactly opposite, the gate driving circuit is set above to make that in the output stage of the shift register unit of one stage (i.e., the charging stage of the shift register unit of the next stage), the timing of the first clock signal terminal and the second clock signal terminal of the shift register unit of the next stage can be shown as the charging stage T3 in FIG. 4.

In this exemplary embodiment, as shown in FIG. 13, the gate driving circuit only shows four cascaded shift register units. It should be understood that the gate driving circuit may also include cascaded shift register units of other numbers.

In this exemplary embodiment, the gate driving circuit may further include a reset signal line Reset. The reset signal line Reset is used to connect the reset signal terminal Re of each shift register unit, and the reset signal line Reset is used to provide a reset signal to the reset signal terminal Re of the shift register unit.

The exemplary embodiment also provides a display panel including the above-mentioned gate driving circuit. The display panel can be applied to display apparatuses such as TVs, mobile phones, and tablet computers.

Those skilled in the art will easily think of other embodiments of the present disclosure after considering the specification and practicing the disclosure disclosed herein. This application is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are only regarded as exemplary, and the true scope and spirit of the present disclosure are pointed out by the claims.

It should be understood that the present disclosure is not limited to the precise structure that has been described above and shown in the drawings, and various modifications and changes can be made without departing from its scope. The scope of the present disclosure is limited only by the appended claims.

What is claimed is:

1. A shift register unit, comprising:
   an input circuit connected to a second clock signal terminal, a signal input terminal, and a first node, and configured to transmit a signal of the signal input terminal to the first node in response to a signal of the second clock signal terminal;
   a charging circuit connected to the first node, a first clock signal terminal, and a pull-up node, and configured to transmit a signal of the first clock signal terminal to the pull-up node in response to signals of the first node and the first clock signal terminal;
   an inverter circuit connected to the signal input terminal, the second clock signal terminal, a first power supply terminal, a second power supply terminal, and a pull-down node, and configured to transmit a signal of the second power supply terminal to the pull-down node in response to the signal of the signal input terminal, and transmit a signal of the first power supply terminal to the pull-down node in response to the signal of the second clock signal terminal;
   an output circuit connected to the pull-up node, the first power supply terminal, and an output terminal, and configured to transmit the signal of the first power supply terminal to the output terminal in response to a signal of the pull-up node; and
   a pull-down circuit connected to the pull-down node, the second power supply terminal, the pull-up node, and the output terminal, and configured to transmit the signal of the second power supply terminal to the pull-up node and the output terminal in response to a signal of the pull-down node.

2. The shift register unit according to claim 1, further comprising:
   a reset circuit connected to the first power supply terminal, the pull-down node, and a reset signal terminal, and configured to transmit the signal of the first power supply terminal to the pull-down node in response to a signal of the reset signal terminal.

3. The shift register unit according to claim 2, wherein the reset circuit comprises:
   an eleventh switch transistor having a first terminal connected to the first power supply terminal, a second terminal connected to the pull-down node, and a control terminal connected to the reset signal terminal.

4. The shift register unit according to claim 1, wherein the input circuit comprises:
   a first switch transistor having a first terminal connected to the signal input terminal, a second terminal connected to the first node, and a control terminal connected to the second clock signal terminal.

5. The shift register unit according to claim 1, wherein the charging circuit comprises:
   a second switch transistor having a first terminal connected to the first clock signal terminal, a second terminal connected to a second node, and a control terminal connected to the first node;
   a third switch transistor having a first terminal connected to the second node, a second terminal connected to the pull-up node, and a control terminal connected to the first clock signal terminal; and
   a first capacitor connected between the first node and the second node.

6. The shift register unit according to claim 1, wherein the inverter circuit comprises:
   a fourth switch transistor having a first terminal connected to the second clock signal terminal, and a control terminal connected to the first power supply terminal;
   a fifth switch transistor having a first terminal connected to the first power supply terminal, a second terminal connected to the pull-down node, and a control terminal connected to a second terminal of the fourth switch transistor;
   a sixth switch transistor having a first terminal connected to the second terminal of the fourth switch transistor, a second terminal connected to the second power supply terminal, and a control terminal connected to the signal input terminal; and
   a seventh switch transistor having a first terminal connected to the pull-down node, a second terminal connected to the second power supply terminal, and a control terminal connected to the signal input terminal.

7. The shift register unit according to claim 1, wherein the output circuit comprises:
   an eighth switch transistor having a first terminal connected to the first power supply terminal, a second terminal connected to the output terminal, and a control terminal connected to the pull-up node; and
   a second capacitor connected between the first power supply terminal and the pull-up node.

8. The shift register unit according to claim 1, wherein the pull-down circuit comprises:
   a ninth switch transistor having a first terminal connected to the pull-up node, a second terminal connected to the second power supply terminal, and a control terminal connected to the pull-down node;
   a tenth switch transistor having a first terminal connected to the second power supply terminal, a second terminal connected to the output terminal, and a control terminal connected to the pull-down node; and
   a third capacitor connected between the pull-down node and the second power supply terminal.

9. A driving method for driving a shift register unit, comprising:
   providing the shift register unit, wherein the shift register unit comprises:
      an input circuit connected to a second clock signal terminal, a signal input terminal and a first node, and configured to transmit a signal of the signal input terminal to the first node in response to a signal of the second clock signal terminal;
      a charging circuit connected to the first node, a first clock signal terminal and a pull-up node, and configured to transmit a signal of the first clock signal terminal to the pull-up node in response to signals of the first node and the first clock signal terminal;
      an inverter circuit connected to the signal input terminal, the second clock signal terminal, a first power supply terminal, a second power supply terminal and a pull-down node, and configured to transmit a signal of the second power supply terminal to the pull-down node in response to the signal of the signal input terminal, and transmit a signal of the first power supply terminal to the pull-down node in response to the signal of the second clock signal terminal;

an output circuit connected to the pull-up node, the first power supply terminal and an output terminal, and configured to transmit the signal of the first power supply terminal to the output terminal in response to a signal of the pull-up node; and a pull-down circuit connected to the pull-down node, the second power supply terminal, the pull-up node, and the output terminal, and configured to transmit the signal of the second power supply terminal to the pull-up node and the output terminal in response to a signal of the pull-down node, wherein the driving method comprises a first pull-down stage, a first shift stage, a charging stage, an output stage, a holding stage, a second shift stage, and a second pull-down stage sequentially according to a time sequence, wherein, in the first pull-down stage, a turn-off signal is input to the signal input terminal and the first clock signal terminal, and a turn-on signal is input to the second clock signal terminal;

in the first shift stage, a turn-off signal is input to the signal input terminal and the second clock signal terminal, and a turn-on signal is input to the first clock signal terminal;

in the charging stage, a turn-off signal is input to the first clock signal terminal, and a turn-on signal is input to the signal input terminal and the second clock signal terminal;

in the output stage, a turn-off signal is input to the second clock signal terminal, and a turn-on signal is input to the signal input terminal and the first clock signal terminal;

in the holding stage, a turn-off signal is input to the first clock signal terminal, and a turn-on signal is input to the second clock signal terminal and the signal input terminal;

in the second shift stage, a turn-off signal is input to the signal input terminal and the second clock signal terminal, and a turn-on signal is input to the first clock signal terminal; and in the second pull-down stage, a turn-off signal is input to the signal input terminal and the first clock signal terminal, and a turn-on signal is input to the second clock signal terminal.

10. The driving method of the shift register unit according to claim 9, wherein the driving method comprises a plurality of the charging stages and a plurality of the output stages;
the plurality of charging stages and the plurality of output stages are located between the first shift stage and the holding stage according to a time sequence, and the charging stage and the output stage are sequentially spaced apart according to a time sequence.

11. A gate driving circuit, comprising:
a shift register unit comprising:
an input circuit connected to a second clock signal terminal, a signal input terminal and a first node, and configured to transmit a signal of the signal input terminal to the first node in response to a signal of the second clock signal terminal;
a charging circuit connected to the first node, a first clock signal terminal and a pull-up node, and configured to transmit a signal of the first clock signal terminal to the pull-up node in response to signals of the first node and the first clock signal terminal;

an inverter circuit connected to the signal input terminal, the second clock signal terminal, a first power supply terminal, a second power supply terminal and a pull-down node, and configured to transmit a signal of the second power supply terminal to the pull-down node in response to the signal of the signal input terminal, and transmit a signal of the first power supply terminal to the pull-down node in response to the signal of the second clock signal terminal;

an output circuit connected to the pull-up node, the first power supply terminal and an output terminal, and configured to transmit the signal of the first power supply terminal to the output terminal in response to a signal of the pull-up node; and a pull-down circuit connected to the pull-down node, the second power supply terminal, the pull-up node, and the output terminal, and configured to transmit the signal of the second power supply terminal to the pull-up node and the output terminal in response to a signal of the pull-down node, wherein the shift register units are arranged in cascade, and an output terminal of the shift register unit of a previous stage is connected to a signal input terminal of the shift register unit of a next stage;

a first clock signal line connected to first clock signal terminals of shift register units of odd-numbered stages and second clock signal terminals of shift register units of even-numbered stages; and a second clock signal line connected to second clock signal terminals of shift register unit of odd-numbered stage and first clock signal terminals of shift register units of even-numbered stages.

12. The gate driving circuit according to claim 11, further comprising:
a reset circuit connected to the first power supply terminal, the pull-down node and a reset signal terminal, and configured to transmit the signal of the first power supply terminal to the pull-down node in response to a signal of the reset signal terminal.

13. The gate driving circuit according to claim 12, wherein the reset circuit comprises:
an eleventh switch transistor, having a first terminal connected to the first power supply terminal, a second terminal connected to the pull-down node, and a control terminal connected to the reset signal terminal.

14. A display panel, comprising the gate driving circuit according to claim 12.

15. The gate driving circuit according to claim 11, wherein the input circuit comprises:
a first switch transistor having a first terminal connected to the signal input terminal, a second terminal connected to the first node, and a control terminal connected to the second clock signal terminal.

16. The gate driving circuit according to claim 11, wherein the charging circuit comprises:
a second switch transistor having a first terminal connected to the first clock signal terminal, a second terminal connected to a second node, and a control terminal connected to the first node;
a third switch transistor having a first terminal connected to the second node, a second terminal connected to the pull-up node, and a control terminal connected to the first clock signal terminal; and
a first capacitor connected between the first node and the second node.

17. The gate driving circuit according to claim 11, wherein the inverter circuit comprises:

a fourth switch transistor having a first terminal connected to the second clock signal terminal, and a control terminal connected to the first power supply terminal;

a fifth switch transistor having a first terminal connected to the first power supply terminal, a second terminal connected to the pull-down node, and a control terminal connected to a second terminal of the fourth switch transistor;

a sixth switch transistor having a first terminal connected to the second terminal of the fourth switch transistor, a second terminal connected to the second power supply terminal, and a control terminal connected to the signal input terminal; and a seventh switch transistor having a first terminal connected to the pull-down node, a second terminal connected to the second power supply terminal, and a control terminal connected to the signal input terminal.

18. The gate driving circuit according to claim 11, wherein the output circuit comprises:

an eighth switch transistor having a first terminal connected to the first power supply terminal, a second terminal connected to the output terminal, and a control terminal connected to the pull-up node; and a second capacitor connected between the first power supply terminal and the pull-up node.

19. The gate driving circuit according to claim 11, wherein the pull-down circuit comprises:

a ninth switch transistor having a first terminal connected to the pull-up node, a second terminal connected to the second power supply terminal, and a control terminal connected to the pull-down node;

a tenth switch transistor having a first terminal connected to the second power supply terminal, a second terminal connected to the output terminal, and a control terminal connected to the pull-down node; and a third capacitor connected between the pull-down node and the second power supply terminal.

20. A display panel, comprising the gate driving circuit according to claim 11.

* * * * *